(12) United States Patent
Hsieh et al.

(10) Patent No.: US 11,592,466 B2
(45) Date of Patent: Feb. 28, 2023

(54) PROBE CARD DEVICE AND SELF-ALIGNED PROBE

(71) Applicant: CHUNGHWA PRECISION TEST TECH. CO., LTD., Taoyuan (TW)

(72) Inventors: Kai-Chieh Hsieh, Taoyuan (TW); Wei-Jhih Su, Taichung (TW); Hong-Ming Chen, Taoyuan (TW); Vel Sankar Ramachandran, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/491,613

(22) Filed: Oct. 1, 2021

(65) Prior Publication Data
US 2022/0163565 A1    May 26, 2022

(30) Foreign Application Priority Data
Nov. 24, 2020   (TW) ................................ 109141045

(51) Int. Cl.
| G01R 1/073 | (2006.01) |
| G01R 1/067 | (2006.01) |
| H01R 13/24 | (2006.01) |
| H01R 12/70 | (2011.01) |

(52) U.S. Cl.
CPC ..... *G01R 1/07314* (2013.01); *G01R 1/06716* (2013.01); *H01R 12/7005* (2013.01); *H01R 13/2471* (2013.01)

(58) Field of Classification Search
CPC ............ G01R 1/07314; G01R 1/06716; H01R 12/7005; H01R 13/2471
See application file for complete search history.

(56) References Cited

U.S. PATENT DOCUMENTS

| 9,329,205 | B2 * | 5/2016 | Lou ..................... G01R 1/07342 |
| 2018/0003767 | A1 * | 1/2018 | Crippa ............... H01R 13/2435 |
| 2020/0292576 | A1 * | 9/2020 | Perego ............... G01R 1/07378 |

OTHER PUBLICATIONS

English Translation of JP-2015161603-A (Year: 2015).*
English translation of JP2015534079A (Year: 2015).*

* cited by examiner

Primary Examiner — Paresh Patel
(74) Attorney, Agent, or Firm — Li & Cai Intellectual Property (USA) Office

(57) ABSTRACT

A probe card device and a self-aligned probe are provided. The self-aligned probe includes a fixing end portion configured to be abutted against a space transformer, a testing end portion configured to detachably abut against a device under test (DUT), a first connection portion connected to the fixing end portion, a second connection portion connected to the testing end portion, and an arced portion that connects the first connection portion and the second connection portion. The fixing end portion and the testing end portion jointly define a reference line passing there-through. The first connection portion has an aligned protrusion, and a maximum distance between the arced portion and the reference line is greater than 75 μm and is less than 150 μm.

8 Claims, 7 Drawing Sheets

PROBE CARD DEVICE AND SELF-ALIGNED PROBE

CROSS-REFERENCE TO RELATED PATENT APPLICATION

This application claims the benefit of priority to Taiwan Patent Application No. 109141045, filed on Nov. 24, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a conductive probe, and more particularly to a probe card device and a self-aligned probe.

BACKGROUND OF THE DISCLOSURE

A conventional probe card device includes a first guiding board unit, a second guiding board unit that is spaced apart from the first guiding board unit, and a plurality of conductive probes that pass through the first and second guiding board units. A width of a portion of the conventional conductive probe arranged in the first guiding board unit is substantially equal to a width of another portion of the conventional conductive probe, so that the conventional conductive probe and the first guiding board has a large gap (e.g., more than 10 μm) there-between, which affects the development and application of the conventional probe card device.

SUMMARY OF THE DISCLOSURE

In response to the above-referenced technical inadequacy, the present disclosure provides a probe card device and a self-aligned probe to effectively improve on the issues associated with conventional conductive probes.

In one aspect, the present disclosure provides a probe card device, which includes a first guiding board unit, a second guiding board unit spaced apart from the first guiding board unit, and a plurality of self-aligned probes passing through the first guiding board unit and the second guiding board unit. Any two of the self-aligned probes adjacent to each other have an interval there-between. Each of the self-aligned probes includes a fixing end portion, a testing end portion, a first connection portion, a second connection portion, and an arced portion. The fixing end portion is located at an outer side of the first guiding board unit away from the second guiding board unit. The testing end portion is located at an outer side of the second guiding board unit away from the first guiding board unit and is configured to detachably abut against a device under test (DUT). The fixing end portion and the testing end portion jointly define a reference line passing there-through. The first connection portion is located in the first guiding board unit. The first connection portion has an aligned protrusion, so that a gap formed between the first connection portion and the first guiding board unit is less than or equal to 4 μm. The second connection portion is located in the second guiding board unit. The arced portion connects the first connection portion and the second connection portion. Moreover, a largest distance between the arced portion and the reference line is greater than 75 μm and is less than the interval.

In another aspect, the present disclosure provides a self-aligned probe, which includes a fixing end portion, a testing end portion, a first connection portion, a second connection portion, and an arced portion. The fixing end portion is configured to be abutted against a space transformer. The testing end portion is configured to detachably abut against a device under test (DUT). The fixing end portion and the testing end portion jointly define a reference line passing there-through. The first connection portion is connected to the fixing end portion, and the first connection portion has an aligned protrusion. The second connection portion is connected to the testing end portion. The arced portion connects the first connection portion and the second connection portion. Moreover, a largest distance between the arced portion and the reference line is greater than 75 μm and is less than 150 μm.

Therefore, the self-aligned probe of the probe card device in the present disclosure is provided with the first connection portion having the aligned protrusion, so that the gap between the self-aligned probe and the first guiding board unit can be effectively controlled to facilitate the development and application of the probe card device.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
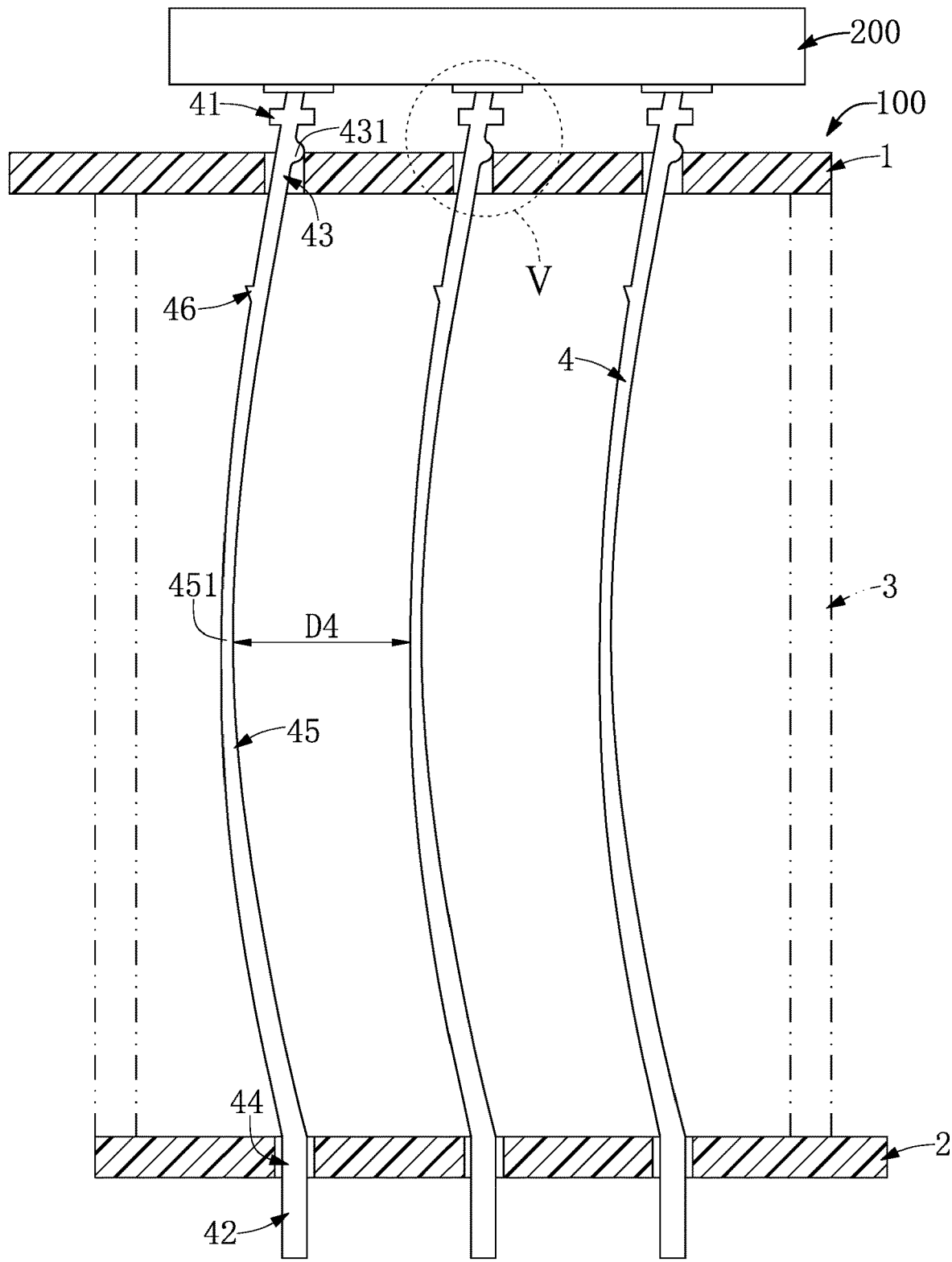
FIG. 1 is a cross-sectional view of a probe card device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
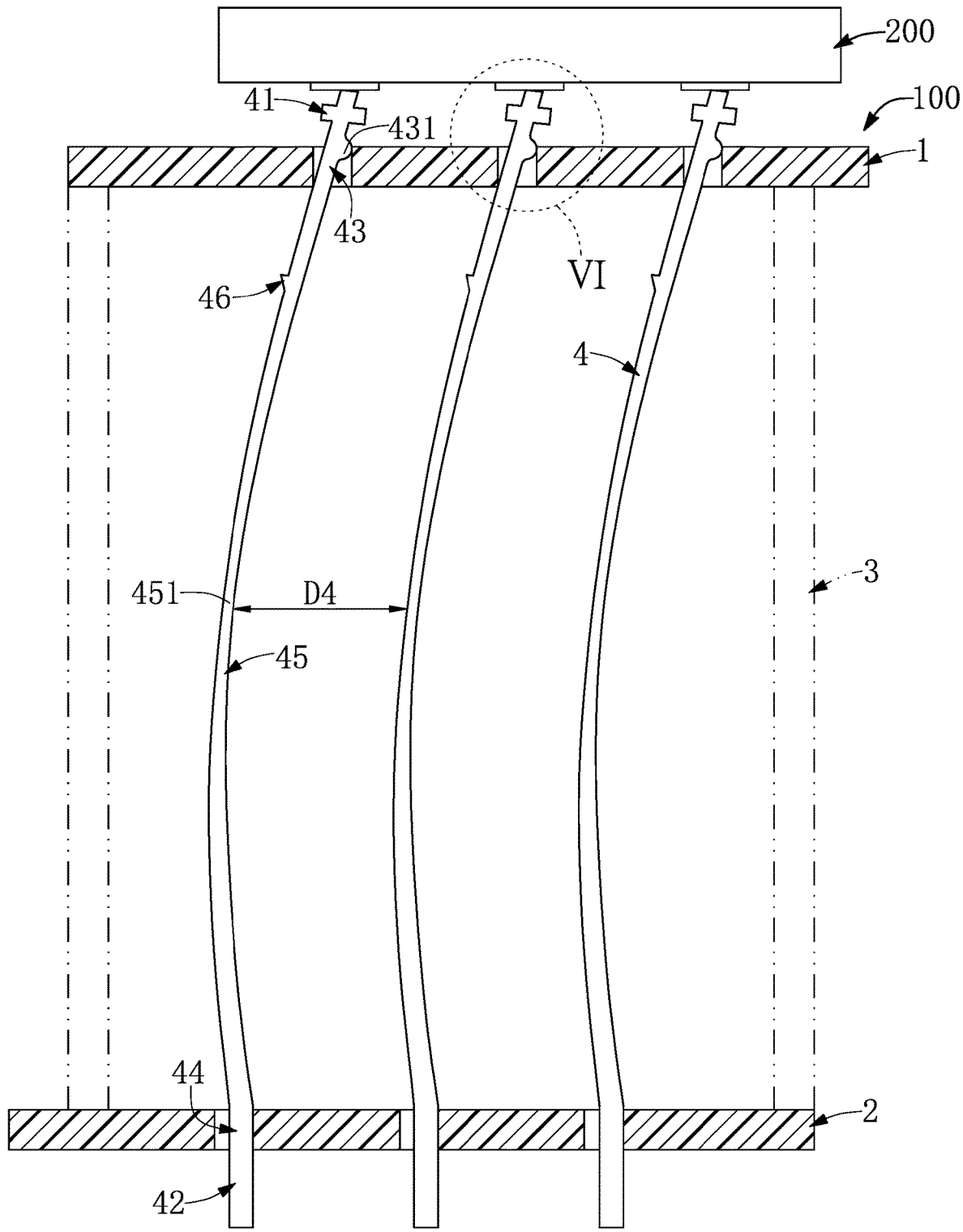
FIG. 2 is a cross-sectional view showing the probe card device of FIG. 1 when a first guiding board unit and a second guiding board unit are in a staggered arrangement.
Figure 3:
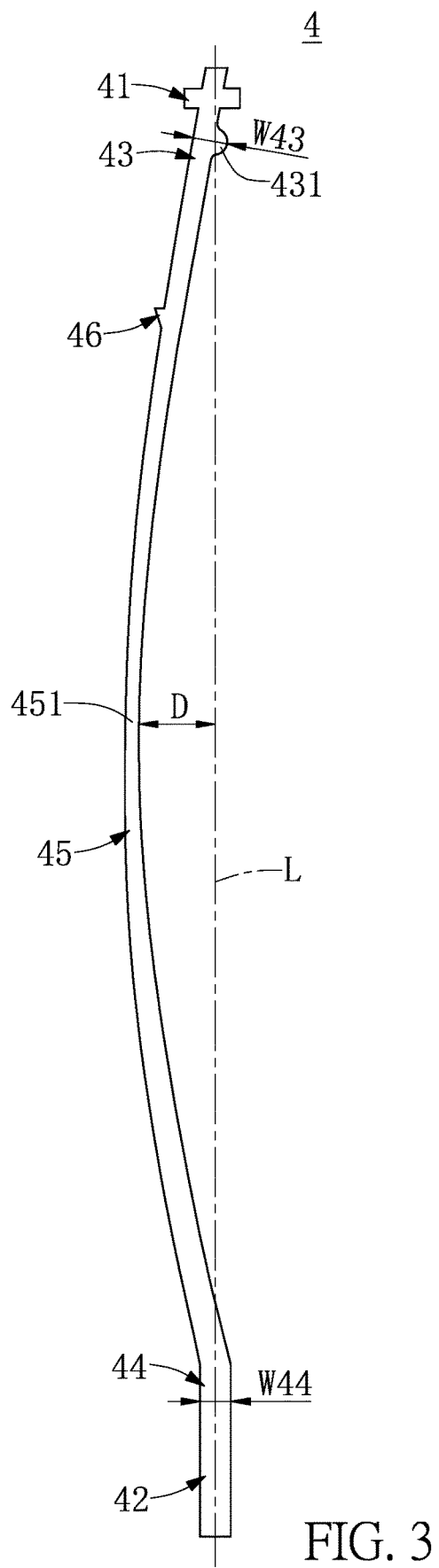
FIG. 3 is a planar view of a self-aligned probe according to the embodiment of the present disclosure.
Figure 4:
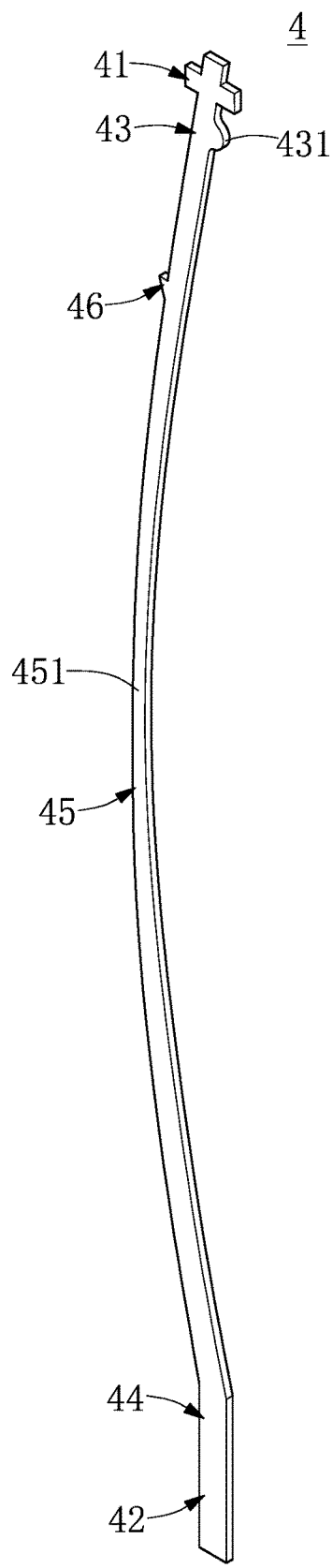
FIG. 4 is a perspective view of the self-aligned probe according to the embodiment of the present disclosure.
Figure 5:
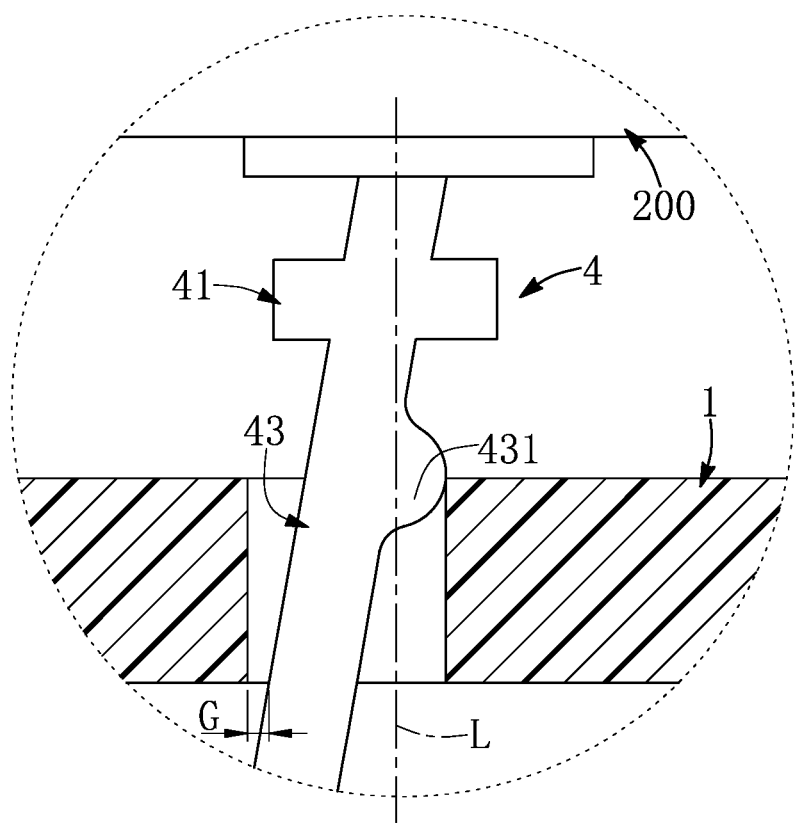
FIG. 5 shows an enlarged view of part V of FIG. 1.

Referring to FIG. 1 to FIG. 6, an embodiment of the present disclosure provides a probe card device 1000 (e.g., a vertical probe card device). As shown in FIG. 1 and FIG. 2, the probe card device 1000 includes a probe head 100 and a space transformer 200 that is connected to one side of the probe head 100 (e.g., a top side of the probe head 100 shown in FIG. 1). Another side of the probe head 100 (e.g., a bottom side of the probe head 100 shown in FIG. 1) is configured to abut against a device under test (DUT) (e.g., a semiconductor wafer that is not shown in the drawings).

It should be noted that in order to clearly describe the structure and connection relationship of each component of the probe card device 1000, the drawings of the present embodiment only show a portion of the probe card device 1000, but the present disclosure is not limited thereto. The following description describes the structure and connection relationship of each component of the probe card device 1000.

As shown in FIG. 1, the probe head 100 includes a first guiding board unit 1, a second guiding board unit 2 spaced apart from the first guiding board unit 1, a spacer 3 sandwiched between the first guiding board unit 1 and the second guiding board unit 2, and a plurality of self-aligned probes 4 that pass through (and are retained by) the first guiding board unit 1 and the second guiding board unit 2. Moreover, any two of the self-aligned probes 4 adjacent to each other have an interval D4 there-between.

It should be noted that the self-aligned probes 4 in the present embodiment are described in cooperation with the first guiding board unit 1, the second guiding board unit 2, and the spacer 3, but the present disclosure is not limited thereto. For example, in other embodiments of the present disclosure not shown in the drawings, the self-aligned probe 4 can be independently used (e.g., sold) or can be used in cooperation with other components.

In the present embodiment, the first guiding board unit 1 includes one first guiding board, and the second guiding board unit 2 includes one second guiding board. However, in other embodiments of the present disclosure not shown in the drawings, the first guiding board unit 1 can include a plurality of first guiding boards, and at least one spacing sheet that is sandwiched between any two of the first guiding boards adjacent to each other, and the second guiding board unit 2 can include a plurality of second guiding boards and at least one spacing sheet that is sandwiched between any two of the second guiding boards adjacent to each other. Furthermore, the first guiding boards are in a staggered arrangement, the second guiding boards are in a staggered arrangement, and the first guiding board unit 1 and the second guiding board unit 2 are staggered with respect to each other.

Moreover, the spacer 3 can be an annular structure and is sandwiched between a peripheral portion of the first guiding board unit 1 and a peripheral portion of the second guiding board unit 2, but the present disclosure is not limited thereto. For example, in other embodiments of the present disclosure not shown in the drawings, the spacer 3 of the probe card device 1000 can be omitted or can be replaced by other components.

As the self-aligned probes 4 in the present embodiment are of the substantially same structure, the following description discloses the structure of just one of the self-aligned probes 4 for the sake of brevity, but the present disclosure is not limited thereto. For example, in other embodiments of the present disclosure not shown in the drawings, the self-aligned probes 4 in the probe head 100 can be of different structures or can be formed with part of the following structures.

Moreover, in order to clearly describe the structure of the self-aligned probe 4, the following description describes the self-aligned probe 4 when the first guiding board unit 1 and the second guiding board unit 2 are not staggered with respect to each other.

As shown in FIG. 1 and FIG. 3 to FIG. 5, the self-aligned probe 4 is integrally formed as a single one-piece structure, and the self-aligned probe 4 includes a fixing end portion 41, a testing end portion 42, a first connection portion 43 connected to the fixing end portion 41, a second connection portion 44 connected to the testing end portion 42, and an arced portion 45 that connects the first connection portion 43 and the second connection portion 44. Moreover, the fixing end portion 41 and the testing end portion 42 are arranged on two opposite ends of the self-aligned probe 4. In other words, the self-aligned probe 4 sequentially includes the fixing end portion 41, the first connection portion 43, the arced portion 45, the second connection portion 44, and the testing end portion 42, but the present disclosure is not limited thereto.

The fixing end portion 41 is located at an outer side of the first guiding board unit 1 (e.g., an upper side of the first guiding board unit 1 shown in FIG. 1) away from the second guiding board unit 2, and the fixing end portion 41 is configured to be abutted against the space transformer 200 that is located adjacent to the first guiding board unit 1. The testing end portion 42 is located at an outer side of the second guiding board unit 2 (e.g., a lower side of the second guiding board unit 2 shown in FIG. 1) away from the first guiding board unit 1, and the testing end portion 42 is configured to detachably abut against the DUT that is located adjacent to the second guiding board unit 2. Moreover, the first connection portion 43 is located in the first guiding board unit 1, the second connection portion 44 is located in the second guiding board unit 2, and the arced portion 45 is located between the first guiding board unit 1 and the second guiding board unit 2.

Specifically, the fixing end portion 41 and the testing end portion 42 jointly define a reference line L passing therethrough. In the present embodiment, the reference line L passes through a center of the fixing end portion 41 and a center of the testing end portion 42, but the present disclosure is not limited thereto. Moreover, a largest distance D between the arced portion 45 and the reference line L is greater than 75 μm and is less than the interval D4 (or 150 μm), but the present disclosure is not limited thereto. In other words, any conductive probe (e.g., a straight-like conductive probe) not having the arced portion 45 is different from the self-aligned probe 4 of the present embodiment.

In the present embodiment, a region of the arced portion 45 of the self-aligned probe 4 corresponding in position to the largest distance D is defined as a narrow region 451, and a cross-sectional area of the arced portion 45 gradually increases in two directions that are from the narrow region 451 toward the first connection portion 43 and the second connection portion 44, respectively. Furthermore, a distance between the narrow region 451 and the first connection portion 43 is equal to a distance between the narrow region 451 and the second connection portion 44. In other words, the narrow region 451 in the present embodiment is arranged on a center region of the arced portion 45.

Accordingly, the arced portion 45 of the self-aligned probe 4 in the present embodiment is formed with the above structure, so that when the arced portion 45 is elastically deformed, stress can be uniformly distributed in the arced portion 45 and is not concentrated in a specific region of the arced portion 45, which can effectively extend a lifespan of the self-aligned probe 4.

The first connection portion 43 has an aligned protrusion 431 that can be at least partially located in the first guiding board unit 1. In other words, the aligned protrusion 431 can be partially located in the first guiding board unit 1, and only a portion of the aligned protrusion 431 in the first guiding board unit 1 can be used to provide an aligned function for the self-aligned probe 4.

Moreover, since the first connection portion 43 is provided with the aligned protrusion 431, a gap G formed between the first connection portion 43 and the first guiding board unit 1 is less than or equal to 4 μm. The gap G in the present embodiment corresponds in position to a space that has a minimum distance between the first connection portion 43 and the first guiding board unit 1. In other words, when the first connection portion 43 is located in a thru-hole (not labeled in the drawings) of the first guiding board unit 1, the gap G between the first connection portion 43 and inner wall of the thru-hole can be controlled to be less than or equal to 4 μm by forming the aligned protrusion 431.

In other words, since the first connection portion 43 is provided with the aligned protrusion 431, a largest width W43 of the first connection portion 43 can be greater than a largest width W44 of the second connection portion 44. Accordingly, difficulty of the self-aligned probe 4 assembled to (or inserted into) the first guiding board unit 1 and the second guiding board unit 2 can be effectively decreased through the above width condition of the self-aligned probe 4. In addition, the cross-sectional area of the self-aligned probe 4 can gradually increase from the narrow region 451 toward the aligned protrusion 431, so that the first connection portion 43 can be provided to share the stress in the arced portion 45.

Moreover, the narrow region 451 and the aligned protrusion 431 in the present embodiment are respectively located at two opposite sides of the reference line L, thereby facilitating the self-aligned probe 4 to be assembled to (or inserted into) the first guiding board unit 1 and the second guiding board unit 2 and maintaining the structural stability of the probe card device 1000, but the present disclosure is not limited thereto. For example, in other embodiments of the present disclosure not shown in the drawings, the narrow region 451 and the aligned protrusion 431 can be located at the same side of the reference line L.

In addition, each of the self-aligned probes 4 has a rib 46 that is formed on the arced portion 45 thereof and that is located adjacent to the first guiding board unit 1. The rib 46 and the aligned protrusion 431 of each of the self-aligned probes 4 are respectively located at the two opposite sides of the reference line L, and the rib 46 of each of the self-aligned probes 4 is not in contact with the first guiding board unit 1. In other words, any rib contacting the first guiding board unit 1 or located at the same side with the aligned protrusion 431 is different from the rib 46 of the present embodiment.

Figure 6:
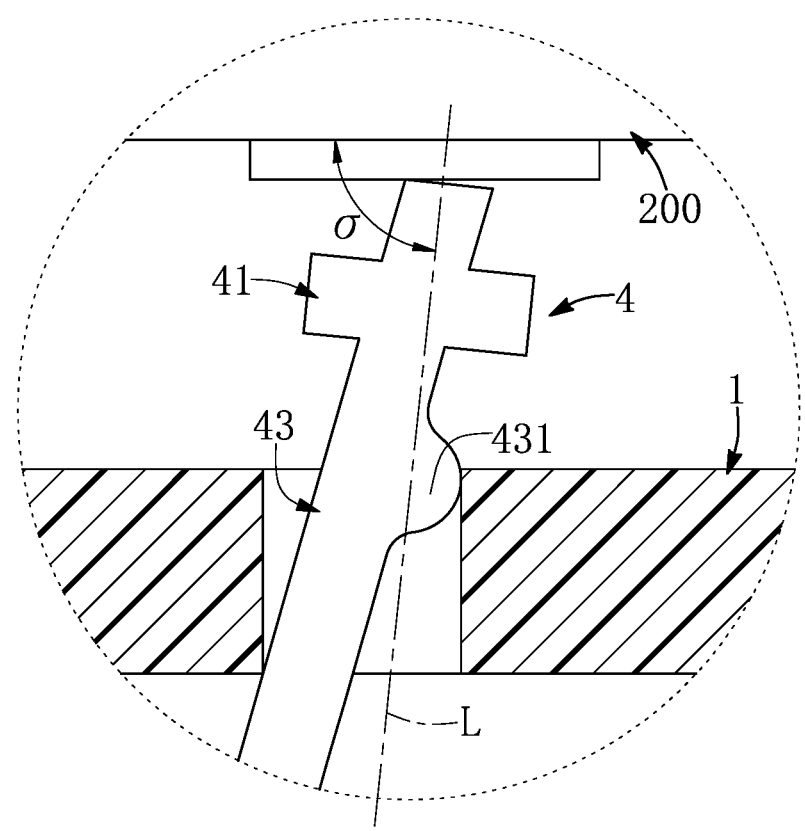
FIG. 6 shows an enlarged view of part VI of FIG. 2.
Figure 7:
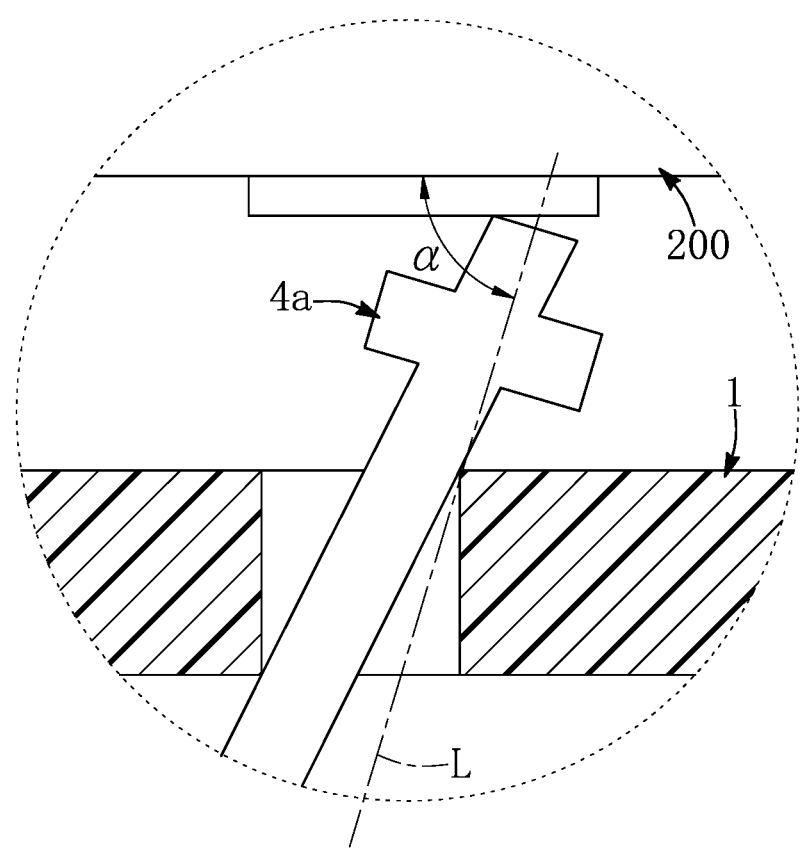
FIG. 7 is an enlarged view showing a conventional probe assembled in a probe head of the embodiment of the present disclosure.

As shown in FIG. 2 and FIG. 6, when the first guiding board unit 1 and the second guiding board unit 2 are in a slantingly staggered arrangement, the arced portions 45 of the aligned probes 4 are distributed in a same orientation, and the fixing end portion 41 of each of the self-aligned probes 4 is abutted against the space transformer 200 at an angle σ within a range from 85 degrees to 95 degrees through the aligned protrusion 431. Moreover, the angle σ in the present embodiment is preferably substantial 90 degrees (e.g., the angle σ can be within a range from 88 degrees to 92 degrees), but the present disclosure is not limited thereto. In other words, as shown in FIG. 7, when the aligned probe 4 is replaced by a conductive probe 4a not having the aligned protrusion 431, the conductive probe 4a is abutted against the space transformer 200 at an angle α less than 85 degrees (e.g., the angle α shown in FIG. 7 is substantial 70 degrees).

Accordingly, the probe card device 1000 in the present embodiment is provided with the self-aligned probe 4 having the above structural design (e.g., the first connection portion 43 has the aligned protrusion 431), so that the gap G between the self-aligned probe 4 and the first guiding board unit 1 can be controlled to facilitate the development and application of the probe card device 1000. The aligned protrusion 431 and the narrow region 451 of the self-aligned probe 4 in the present embodiment are respectively located at two opposite sides of the reference line L, so that the aligned protrusion 431 of the first connection portion 43 can be abutted against the first guiding board unit 1 to share the stress in the arced portion 45, which can extend the lifespan of the self-aligned probe 4.

Furthermore, the gap G between the self-aligned probe 4 and the first guiding board unit 1 can be controlled to be less than or equal to 4 μm, so that an offset resulted from the slantingly staggered arrangement of the first guiding board unit 1 and the second guiding board unit 2 can be effectively reduced. In other words, the fixing end portion 41 can be aligned by the aligned protrusion 431, so that the fixing end portion 41 can be abutted against the space transformer 200 at the angle σ that is within a range from 85 degrees to 95 degrees.

In addition, since the fixing end portion 41 of the self-aligned probe 4 is aligned through the aligned protrusion 431, so that the fixing end portion 41 of the self-aligned probe 4 can be shorten, which facilitates the self-aligned probe 4 to be applied to different tests or applications.

Beneficial Effects of the Embodiment

In conclusion, the self-aligned probe of the probe card device in the present disclosure is provided with the first connection portion having the aligned protrusion, so that the gap between the self-aligned probe and the first guiding board unit can be effectively controlled to facilitate the development and application of the probe card device.

Moreover, the arced portion of the self-aligned probe in the present disclosure is formed with the above structure, so that when the arced portion is elastically deformed, the stress can be uniformly distributed in the arced portion and is not concentrated in the specific region of the arced portion, which effectively extends the lifespan of the self-aligned probe.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   a first guiding board unit and a second guiding board unit that is spaced apart from the first guiding board unit; and
   a plurality of self-aligned probes passing through the first guiding board unit and the second guiding board unit, wherein any two of the self-aligned probes adjacent to each other have an interval there-between, and each of the self-aligned probes includes:
      a fixing end portion located at an outer side of the first guiding board unit away from the second guiding board unit;
      a testing end portion located at an outer side of the second guiding board unit away from the first guiding board unit and configured to detachably abut against a device under test (DUT), wherein the fixing end portion and the testing end portion jointly define a reference line passing there-through;
      a first connection portion located in the first guiding board unit, wherein the first connection portion has an aligned protrusion, so that a gap formed between the first connection portion and the first guiding board unit is less than or equal to 4 µm;
      a second connection portion located in the second guiding board unit; and
      an arced portion connecting the first connection portion and the second connection portion, wherein a largest distance between the arced portion and the reference line is greater than 75 µm and is less than the interval;
      wherein a region of the arced portion of each of the self-aligned probes corresponding in position to the largest distance is defined as a narrow region, and wherein in each of the self-aligned probes, a cross-sectional area of the arced portion gradually increases in two directions that extend from the narrow region toward the first connection portion and the second connection portion, respectively.

2. The probe card device according to claim 1, wherein in each of the self-aligned probes, a distance between the narrow region and the first connection portion is equal to a distance between the narrow region and the second connection portion.

3. The probe card device according to claim 1, wherein in each of the self-aligned probes, the narrow region and the aligned protrusion are respectively located at two opposite sides of the reference line.

4. The probe card device according to claim 1, wherein each of the self-aligned probes has a rib that is formed on the arced portion thereof and that is located adjacent to the first guiding board unit, and wherein the rib and the aligned protrusion of each of the self-aligned probes are respectively located at two opposite sides of the reference line, and the rib of each of the self-aligned probes is not in contact with the first guiding board unit.

5. The probe card device according to claim 1, wherein in each of the self-aligned probes, a largest width of the first connection portion is greater than a largest width of the second connection portion.

6. The probe card device according to claim 1, further comprising a space transformer located adjacent to the first guiding board unit, wherein, when the first guiding board unit and the second guiding board unit are in a slantingly staggered arrangement, the fixing end portion of each of the self-aligned probes is abutted against the space transformer at an angle within a range from 85 degrees to 95 degrees through the aligned protrusion.

7. A self-aligned probe, comprising:
   a fixing end portion configured to abut against a space transformer;
   a testing end portion configured to detachably abut against a device under test (DUT), wherein the fixing end portion and the testing end portion jointly define a reference line passing there-through;
   a first connection portion connected to the fixing end portion, wherein the first connection portion has an aligned protrusion;
   a second connection portion connected to the testing end portion; and
   an arced portion connecting the first connection portion and the second connection portion, wherein a largest distance between the arced portion and the reference line is greater than 75 µm and is less than 150 µm;
   wherein a region of the arced portion corresponding in position to the largest distance is defined as a narrow region, and wherein a cross-sectional area of the arced portion gradually increases in two directions that are from the narrow region toward the first connection portion and the second connection portion, respectively.

8. The self-aligned probe according to claim 7, wherein a distance between the narrow region and the first connection portion is equal to a distance between the narrow region and the second connection portion.

* * * * *